United States Patent
Sarraj et al.

(10) Patent No.: US 8,570,205 B2
(45) Date of Patent: Oct. 29, 2013

(54) ANALOG TO DIGITAL CONVERTER WITH LEAKAGE CURRENT CORRECTION CIRCUIT

(75) Inventors: Maher Mahmoud Sarraj, Plano, TX (US); Haydar Bilhan, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 100 days.

(21) Appl. No.: 13/363,471

(22) Filed: Feb. 1, 2012

(65) Prior Publication Data

US 2013/0194122 A1 Aug. 1, 2013

(51) Int. Cl.
*H03M 1/40* (2006.01)

(52) U.S. Cl.
USPC ............ 341/161; 341/118; 341/150; 341/172

(58) Field of Classification Search
USPC .......... 341/118–121, 150, 161, 162, 163, 172
See application file for complete search history.

(56) References Cited

U.S. PATENT DOCUMENTS

| | | | | |
|---|---|---|---|---|
| 5,367,302 A | * | 11/1994 | Kalthoff et al. | 341/166 |
| 5,831,562 A | * | 11/1998 | Van Auken et al. | 341/122 |
| 8,339,299 B2 | * | 12/2012 | Quiquempoix et al. | 341/143 |
| 2012/0280841 A1 | * | 11/2012 | Wang et al. | 341/110 |

\* cited by examiner

*Primary Examiner* — Howard Williams
(74) *Attorney, Agent, or Firm* — Robert D. Marshall, Jr.; Wade James Brady, III; Frederick J. Telecky, Jr.

(57) ABSTRACT

An analog to digital converter includes leakage current correction circuitry to cancel leakage current injected by a reset switch employing a dummy PMOS switch with a shape factor substantially similar to that of the reset switch. An operational amplifier replicates the voltage of the comparator sense input node to the drain of the dummy transistor to create the same operating point as the reset switch. The resulting leakage current is then repeated and fed back to the node to cancel the offending leakage current.

15 Claims, 4 Drawing Sheets

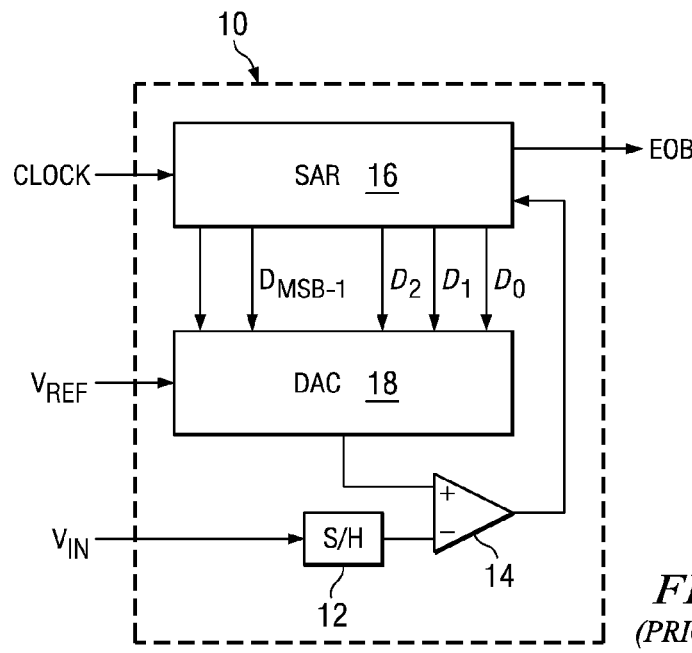
FIG. 1
*(PRIOR ART)*
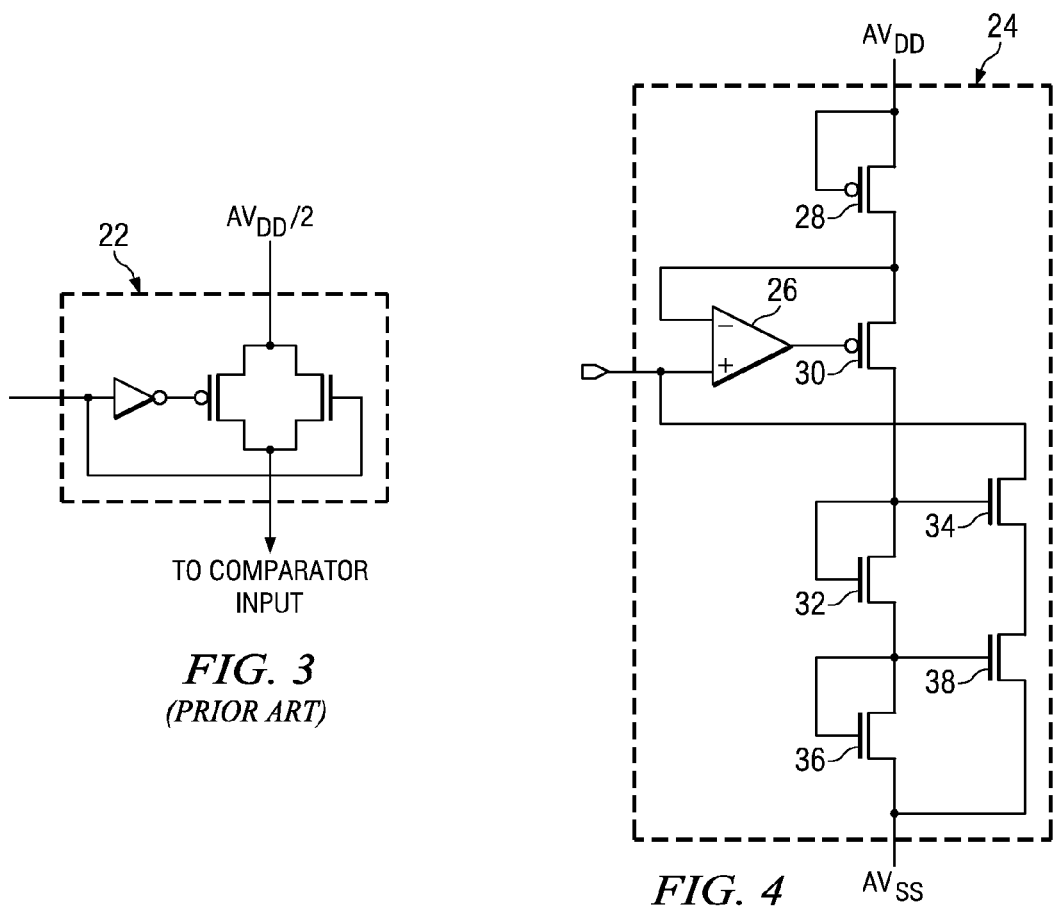
FIG. 3
*(PRIOR ART)*
FIG. 4

ANALOG TO DIGITAL CONVERTER WITH LEAKAGE CURRENT CORRECTION CIRCUIT

FIELD OF THE INVENTION

The invention generally relates to the field of analog to digital converters and more specifically to systems and methods of correcting linearity errors induced by leakage current.

BACKGROUND OF THE INVENTION

Reference is now made to FIG. 1 which depicts a general block diagram of a successive approximation analog to digital converter 10. The successive approximation analog to digital converter 10 comprises a sample and hold circuit 12, a comparator 14, a successive approximation register (SAR) 16, and a digital to analog converter (DAC) 18. The sample and hold circuit 12 acquires an analog input voltage V. The comparator 14 compares analog input voltage $V_{in}$ to the analog output voltage of the DAC 18 and outputs a digital signal to the SAR 16 representative of the comparison. The SAR 16 supplies an approximate digital representation of analog input voltage $V_{in}$ to the DAC 18 and the DAC 18 supplies the comparator 14 with the analog voltage equivalent of the digital output of the SAR 16 for comparison with analog input voltage $V_{in}$. The SAR 16 is initialized so that the most significant bit ($D_{MSB}$) is equal to a digital 1. This code is fed into the DAC, which then supplies the analog equivalent of this digital code ($V_{REF}/2$) into the comparator 14 for comparison with the sampled input voltage $V_{in}$ held by the output of sample and hold circuit 12. If the analog input voltage $V_{in}$ exceeds $V_{REF}$ the comparator 14 signals the SAR 16 to set $D_{MSB}$ to 0 otherwise, $D_{MSB}$ remains a 1. Next $D_{MSB-1}$ is set to 1 and the same test is performed by comparator 14. This cycle is repeated with the next bit until every bit in the SAR 16 has been tested down to $D_0$. The resulting output from the SAR 16 at the end of the conversion (EOB) is the digital approximation of the sampled input voltage $V_{in}$ which is finally output by the DAC 18.

Reference is now made to FIG. 2 which depicts a differential input, switched capacitor/resistor DAC 18 for use with a successive approximation analog to digital converter. The switched capacitor DAC 18 comprises an array 20 of individually switched, binary-weighted capacitors 1C-16C in combination with resistor divider array 21 having resistors R1-R128. It is to be understood that the DAC 18 could be implemented entirely with switched capacitors without the resistor divider array 21 without departing from the scope of the present invention. The digitization cycle starts by sampling the differential analog input ($A_{INM}, A_{INP}$) and resetting the sense nodes of comparator 14 to half the analog supply ($AV_{DD}/2$) by switching on comparator input reset switches 22a and 22b. A Person Having Ordinary Skill in the Art (PHOSITA) will readily recognize that only one switch is used for single-ended applications. The reset switches 22a and 22b are turned off during the approximation cycles (12 clock cycles for 12 bit ADC). During this time however, as explained in more detail herein below, switches 22a and 22b are injecting undesirable, voltage dependent leakage current into the input sense nodes of comparator 14 which accumulate enough charge to cause significant linearity errors. The problem is particularly acute at strong CMOS model corners and elevated temperatures when using deep submicron processes.

Reference is now made to FIG. 3 that depicts a typical switch 22 used for reset switches 22a and 22b. Switch 22 comprises a pMOS transistor and nMOS transistor coupled in parallel with their respective source and drain terminals coupled together. The gates of the pMOS and nMOS transistors are controlled in a complementary manner so that both transistors are either on or off When the voltage on the gate terminal is a logical 1 both the pMOS and nMOS transistor conduct and pass the signal between the analog supply ($AV_{DD}/2$) and an input sense node on comparator 14. When the voltage on the gate terminal is a logical 0, both transistors are turned off forcing a high-impedance condition. In such an arrangement, the pMOS transistor in the switch 22 typically leaks current through the NWELL bulk node. Accordingly, the leakage current degrades the linearity of the analog to digital converter during successive approximation cycles.

BRIEF DESCRIPTION OF THE DRAWINGS

Particular embodiments in accordance with the invention will now be described, by way of example only, and with reference to the accompanying drawings:

FIG. 1 is a block diagram of a prior art successive approximation analog-to-digital converter.

FIG. 3 is a schematic diagram of a prior art switch used to reset comparator inputs;

FIG. 4 is a schematic diagram of an analog leakage current correction circuit in accordance with principles of the present invention;

DETAILED DESCRIPTION OF EMBODIMENTS OF THE INVENTION

Figure 2:
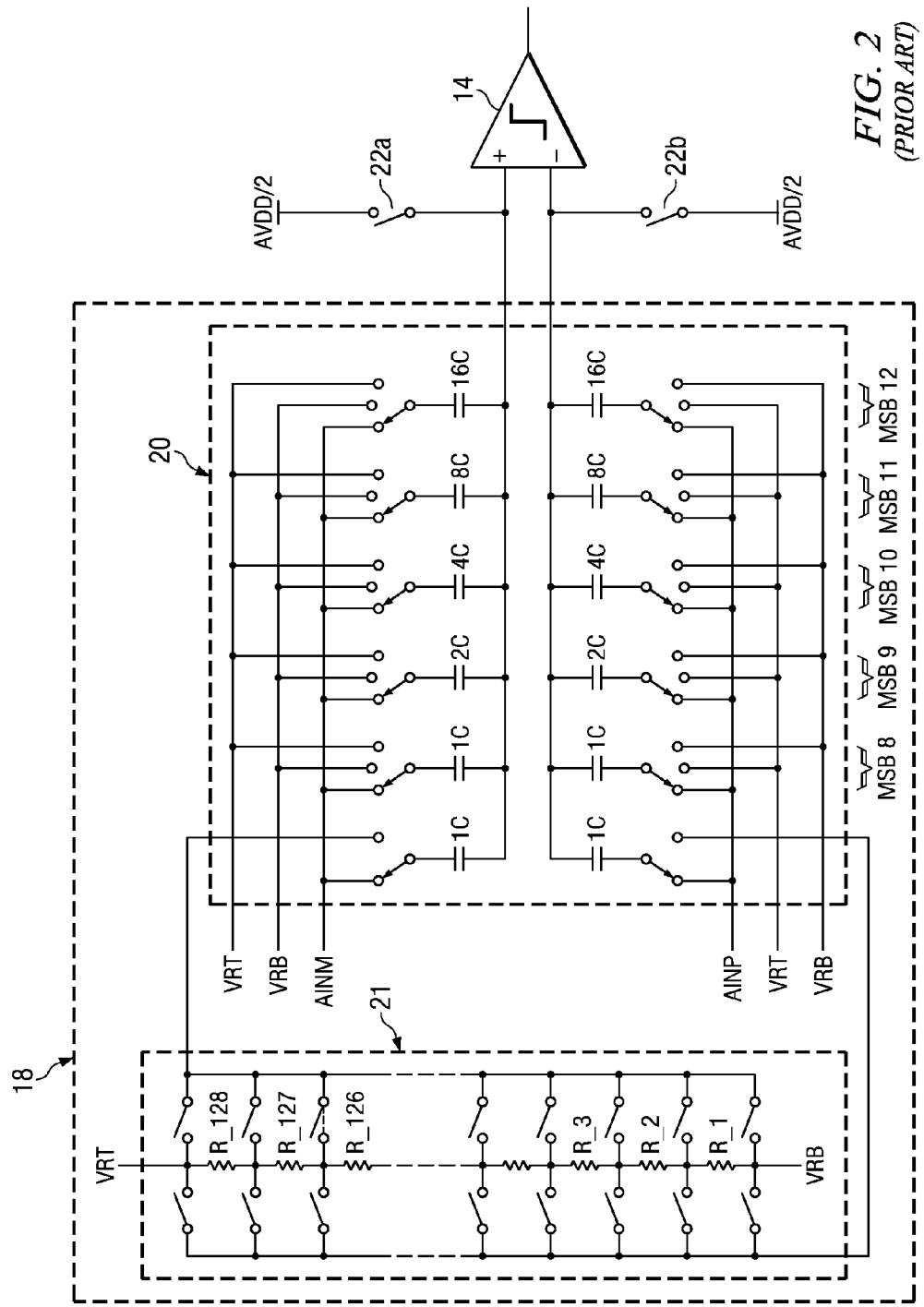
FIG. 2 is a schematic diagram of a prior art successive approximation analog to digital converter employing a switched capacitor DAC.

Before the present invention is described in further detail, it is to be understood that the invention is not limited to the particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by a PHOSITA to which this invention belongs. Although any methods and materials similar or equivalent to those described herein can also be used in the practice or testing of the present invention, a limited number of the exemplary methods and materials are described herein.

It must be noted that as used herein and in the appended claims, the singular forms "a", "an", and "the" include plural referents unless the context clearly dictates otherwise.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates, which may need to be independently confirmed.

Reference is now made to the Figures wherein like numerals indicate corresponding parts throughout the several views. In particular, FIG. 4 depicts a schematic diagram of an analog leakage current correction circuit 24 in accordance with principles of the present invention. The analog leakage current correction circuit 24 includes an operational amplifier 26, a first pMOS transistor 28, a second pMOS transistor 30, first nMOS transistor 32, second nMOS transistor 34, third nMOS transistor 36 and fourth nMOS transistor 38.

The source and drain terminals of first pMOS transistor 28 are connected to the positive analog supply voltage designated as $AV_{DD}$. The drain terminal of first pMOS transistor 28 is connected to the source terminal of second pMOS transistor 30 and to an inverting input of operational amplifier 26. The gate terminal of second pMOS transistor 30 is connected to the output of operational amplifier 26. The drain terminal of second pMOS transistor 30 is connected to the gate and drain terminals of first nMOS transistor 32 and to the gate terminal of second nMOS transistor 34. The source terminal of second nMOS transistor 34 is connected to the drain terminal of fourth nMOS transistor 38. The non-inverting input of operational amplifier 26 is connected to the drain terminal of second nMOS transistor 34 and to an input node on comparator 14 as described in more detail below.

The source terminal of first nMOS transistor 32 is connected to the gate and drain terminals of third nMOS transistor 36 and to the gate terminal of fourth nMOS transistor 38. The source terminals for the third nMOS transistor 36 and the fourth nMOS transistor 38 are connected to the negative supply voltage designated as $AV_{SS}$.

It is preferable that first nMOS transistor 32, second nMOS transistor 34, third nMOS transistor 36 and fourth nMOS transistor 38 all have substantially the same transistor shape factor (W/L) wherein W is the channel width and L is the channel length of the transistor. At the very least, it is desirable that first nMOS transistor 32 and second nMOS transistor 34 have substantially the same transistor shape factor W/L and third nMOS transistor 36 and fourth nMOS transistor 38 have substantially the same transistor shape factor W/L. It is also preferable that first pMOS transistor 28 have substantially the same transistor shape factor (W/L) as the pMOS device that is a portion of switch 22, as described in more detail below. So long as the first pMOS transistor 28 has substantially the same transistor shape factor W/L as the pMOS device that is a portion of switch 22, any size reset switch 22 can be used to cancel leakage current. The analog leakage current correction circuit 24 is substantially independent of process variation and operation temperature.

As described in more detail below, operational amplifier 26 replicates the voltage from the input sense node on comparator 14 to the drain terminal on the first pMOS transistor 28 to create the same operating point as the reset switch 22. The resulting leakage current is then repeated and fed back to the input sense node to cancel the offending leakage current.

Figure 5:
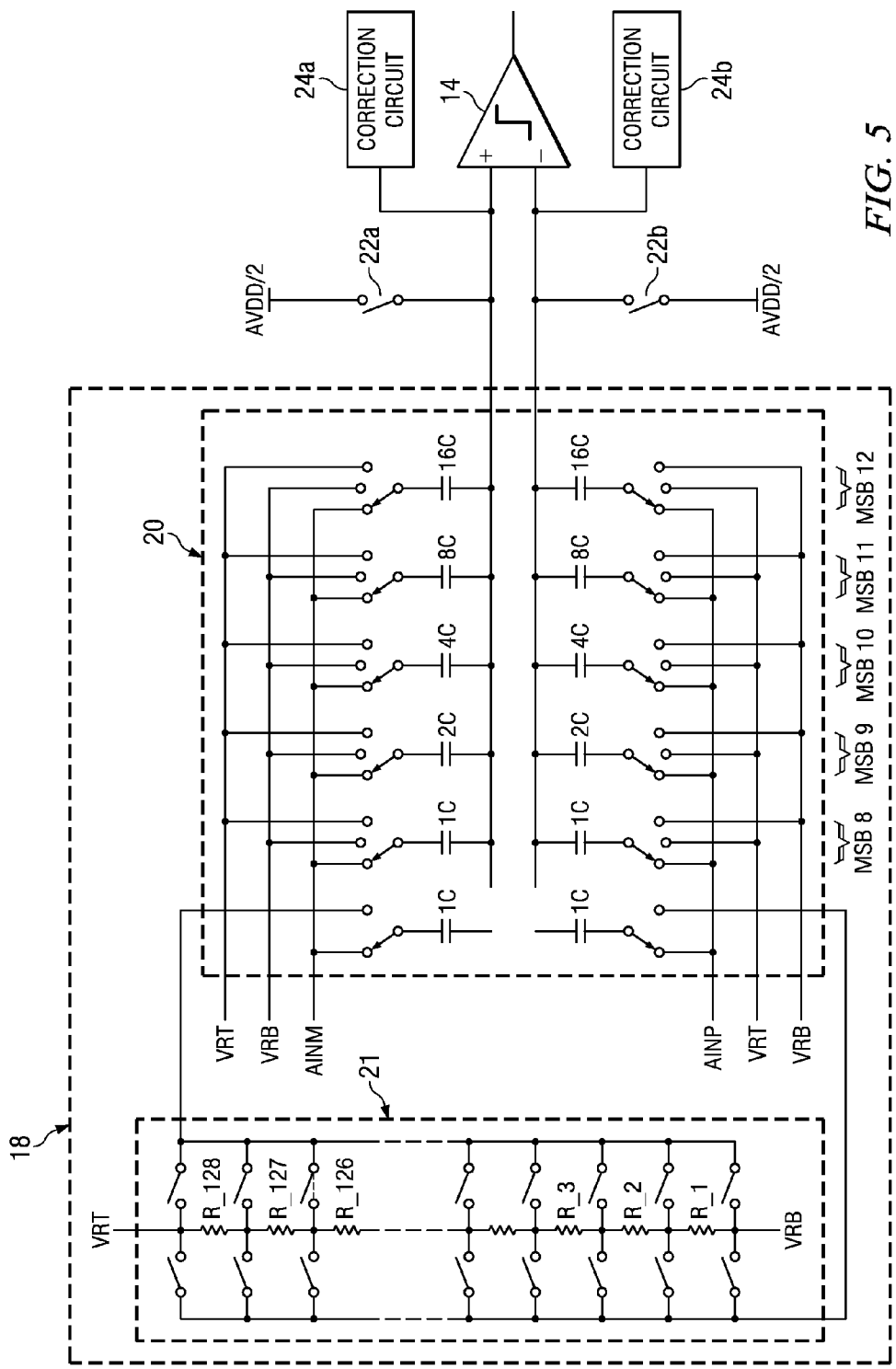
FIG. 5 is schematic diagram of a successive approximation analog to digital converter employing a switched capacitor DAC with the leakage current correction circuit depicted in FIG. 4; and, FIG. 6 is a graph depicting the transient response of a switched capacitor, successive approximation, analog to digital converter with and without the leakage current cancellation circuit of the present invention.

Reference is now made to FIG. 5 depicting a schematic diagram of a successive approximation analog to digital converter employing a switched capacitor DAC with the leakage current correction circuit depicted in FIG. 4. The switched capacitor DAC 18 comprises an array 20 of individually switched, binary-weighted capacitors 1C-16C in combination with resistor divider array 21 having resistors R1-R128. It is to be understood that the DAC 18 could be implemented entirely with switched capacitors without the resistor divider array 21 without departing from the scope of the present invention. The digitization cycle starts by sampling the differential analog input ($A_{INM}$ $A_{INP}$) and resetting the sense nodes of comparator 14 to half the analog supply ($AV_{DD}/2$) by switching on comparator input reset switches 22a and 22b. A Person Having Ordinary Skill in the Art (PHOSITA) will readily recognize that only one switch is used for single-ended applications. The reset switches 22a and 22b are turned off during the approximation cycles (12 clock cycles for 12 bit ADC). During this time, switches 22a and 22b are injecting undesirable, voltage dependent leakage current into the input sense nodes of comparator 14 which accumulate enough charge to cause significant linearity errors.

Correction circuits 24a and 24b are connected respectively to the positive and negative sense nodes on comparator 14. As described above, correction Circuits 24a and 24b cancel the unwanted leakage current injected by switches 22a and 22b respectively.

Figure 6:
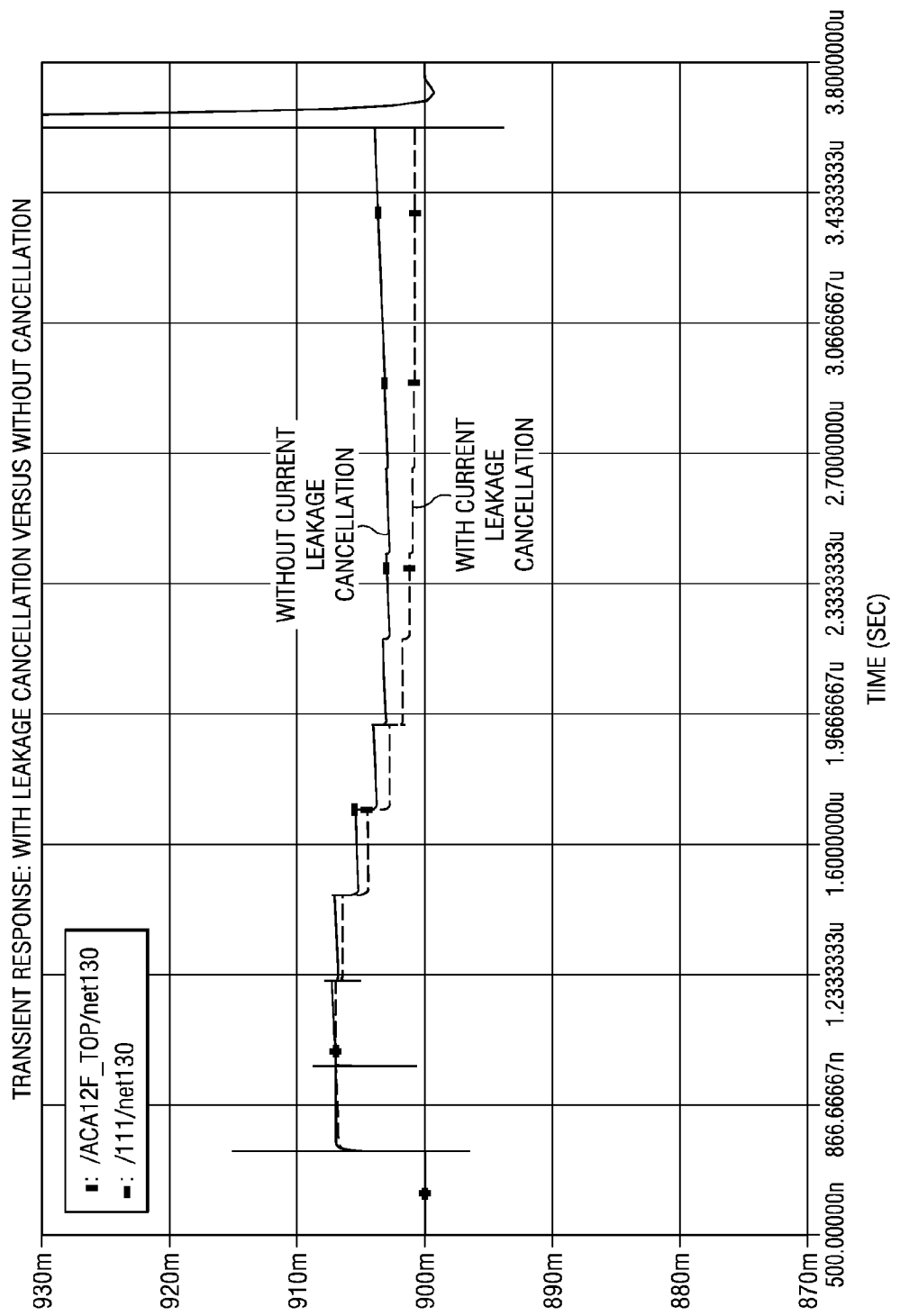

Reference is now made to FIG. 6 depicting a graph of the transient response of a switched capacitor successive approximation analog to digital converter with and without the leakage current cancellation circuit 24 of the present invention. It can be seen that the leakage current cancellation circuit 24 corrects, in the present example, for approximately 4 millivolts which is approximately x bits of error for a 12 bit, 1.8 volt scale analog to digital converter.

Thus, specific systems and methods of correcting linearity errors induced by leakage current in a switched capacitor, successive approximation analog to digital converter have been disclosed. It should be apparent, however, to those skilled in the art that many more modifications besides those already described are possible without departing from the inventive concepts herein. The inventive subject matter, therefore, is not to be restricted except in the spirit of the disclosure. Moreover, in interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. In an analog to digital converter having a switched capacitor digital to analog converter, a reset switch, a dummy transistor having a shape factor substantially identical to that of the reset switch and a comparator, a method of cancelling a leakage current induced by the reset switch comprising steps of:
   (a) replicating a voltage appearing on an input sense node to the comparator onto a drain terminal on the dummy transistor to create a cancelling leakage current substantially similar to the leakage current induced by the reset switch; and, (b) feeding back the cancelling leakage current to the input sense node of the comparator to cancel the leakage current.

2. The method of claim 1 wherein the analog to digital converter includes a second reset switch and a second dummy transistor and steps (a)-(b) are performed for the second reset switch.

3. The method of claim 1 wherein the reset switch is coupled between the input sense node and a voltage equal to substantially half the supply voltage.

4. The method of claim 1 wherein the dummy transistor is a pMOS transistor.

5. The method of claim 1 wherein the reset switch comprises a pMOS transistor and an nMOS transistor coupled in parallel with respective source and drain terminals coupled together.

6. In an analog to digital converter having a switched capacitor digital to analog converter, a reset switch and a comparator, a leakage current correction circuit comprising:
a dummy transistor having a shape factor substantially identical to that of the reset switch;
circuitry to replicate a voltage appearing on an input sense node to the comparator onto a drain terminal on the dummy transistor to create a cancelling leakage current substantially similar to the leakage current induced by the reset switch; and,
circuitry to feed back the cancelling leakage current to the input sense node of the comparator to cancel the leakage current.

7. An analog to digital converter comprising:
a switched capacitor digital to analog converter;
at least one reset switch;
a comparator, and,
at least one leakage current correction circuit having a dummy transistor with a shape factor substantially identical to that of the at least one reset switch and circuitry to replicate a voltage appearing on an input sense node to the comparator onto a drain terminal on the dummy transistor to create a cancelling leakage current substantially similar to the leakage current induced by the reset switch and circuitry to feed back the cancelling leakage current to the input sense node of the comparator to cancel the leakage current.

8. The analog to digital converter of claim 7 wherein the at least one reset switch is coupled between the input node and a voltage substantially one half the voltage supply rail.

9. The analog to digital converter of claim 7 wherein the at least one leakage current correction circuit includes a plurality of correction circuits.

10. The analog to digital converter of claim 7 wherein the switched capacitor digital to analog converter comprises an array of individually switched, binary-weighted capacitors in combination with a resistor divider array.

11. The analog to digital converter of claim 7 wherein the switched capacitor digital to analog converter has a differential input.

12. A leakage current correction circuit comprising:
an operational amplifier having an inverting input, a non-inverting input and an output;
a first pMOS transistor having source, gate and drain terminals;
a second pMOS transistor having source, gate and drain terminals,
a first nMOS transistor having source, gate and drain terminals;
a second nMOS transistor having source, gate and drain terminals,
a third nMOS transistor having source, gate and drain terminals;
a fourth nMOS transistor having source, gate and drain terminals; wherein
the gate and drain terminals of the first pMOS transistor are connected to a positive supply voltage;
the drain terminal of the first pMOS transistor is connected to the source terminal of second pMOS transistor and to the inverting input of operational amplifier;
the gate terminal of the second pMOS transistor is connected to the output of operational amplifier;
the drain terminal of the second pMOS transistor is connected to the gate and the drain terminals of the first nMOS transistor and to the gate terminal of the second nMOS transistor;
the source terminal of the second nMOS transistor is connected to the drain terminal of the fourth nMOS transistor;
the non-inverting input of the operational amplifier is connected to the drain terminal of second nMOS transistor and to an input node on a comparator;
the source terminal of the first nMOS transistor is connected to the gate and the drain terminals of the third nMOS transistor and to the gate terminal of the fourth nMOS transistor;
the source terminal of the second nMOS transistor is connected to the drain terminal of the fourth nMOS transistor; and,
the source terminal of the third nMOS transistor and the fourth nMOS transistor are connected to a negative supply voltage.

13. The leakage current correction circuit of claim 12 wherein the first nMOS transistor and second nMOS transistor have substantially similar transistor shape factors.

14. The leakage current correction circuit of claim 12 wherein the third nMOS transistor and fourth nMOS transistor have substantially similar transistor shape factors.

15. The leakage current circuit of claim 12 wherein the first nMOS transistor, second nMOS transistor, third nMOS transistor and fourth nMOS transistor have substantially similar transistor shape factors.

* * * * *